(12) United States Patent
Edmonson et al.

(10) Patent No.: US 7,623,353 B2
(45) Date of Patent: Nov. 24, 2009

(54) SECURING AN ELECTRICAL SUB-CIRCUIT ASSEMBLY TO A PRINTED CIRCUIT BOARD

(76) Inventors: Peter J. Edmonson, 138 Stone Church Road East, Hamilton, ON (CA) L9B 1A9; Stephen T. Makk, 9 Prince Andrew Place, Toronto, ON (CA) M3C 2H2

( * ) Notice: Subject to any disclaimer, the term of this patent is extended or adjusted under 35 U.S.C. 154(b) by 440 days.

(21) Appl. No.: 11/223,023

(22) Filed: Sep. 12, 2005

(65) Prior Publication Data
US 2007/0096604 A1 May 3, 2007

(51) Int. Cl.
*H05K 1/18* (2006.01)
(52) U.S. Cl. .................. 361/763; 361/764; 361/784
(58) Field of Classification Search ......... 361/764–766, 361/780–785
See application file for complete search history.

(56) References Cited

U.S. PATENT DOCUMENTS

| | | | | |
|---|---|---|---|---|
| 6,221,694 B1 * | 4/2001 | Bhatt et al. | ................ | 438/122 |
| 6,351,027 B1 * | 2/2002 | Giboney et al. | ............. | 257/684 |
| 6,483,398 B2 * | 11/2002 | Nagamori et al. | ........... | 333/116 |
| 6,534,901 B1 * | 3/2003 | Tsuzuki et al. | ............. | 310/348 |
| 6,873,529 B2 * | 3/2005 | Ikuta et al. | .................. | 361/719 |
| 2005/0117271 A1 * | 6/2005 | De Samber et al. | ...... | 361/306.1 |

* cited by examiner

*Primary Examiner*—Tuan T Dinh
(74) *Attorney, Agent, or Firm*—Alexander Ross; Steven M. Greenberg, Esq.; Carey, Rodriguez, Greenberg & Paul, LLP

(57) ABSTRACT

An electrical sub-circuit assembly is secured to a printed circuit board by providing a printed circuit board with a basin, the printed circuit board having electrical pathways leading to the top or side or on the bottom of said basin, and positioning an electrical sub-circuit assembly in the basin, the sub-circuit assembly having dimensions corresponding to the size of the basin so as to be a close fit therein and having electrical connections which locate adjacent corresponding electrical pathways on the printed circuit board. The sub-circuit assembly is secured in the basin, and the electrical connections on the sub-circuit assembly are connected to the corresponding pathways on the printed circuit board.

6 Claims, 7 Drawing Sheets

(a)

(b)

SECURING AN ELECTRICAL SUB-CIRCUIT ASSEMBLY TO A PRINTED CIRCUIT BOARD

FIELD OF INVENTION

This invention relates to securing electrical sub-circuit assemblies to printed circuit boards.

BACKGROUND OF INVENTION

Within a main circuit system, there may frequently be a number of individual sub-circuits which are each contained within a separate assembly, which may be a packaged assembly. Such sub-circuits may for example be transistor dies, integrated circuit dies or passive components. Both the physical attachment of such sub-circuit assemblies to a main circuit package and the electrical interconnections therebetween may be unreliable in terms of their rigidity and power handling capabilities and often produce poor electrical impedance matching results thereby producing high insertion loss between the interconnections. Prior art methods of providing electrical conductivity between a main circuit and a sub-circuit using bond wires or bump connections often result in mismatch of the electrical circuits, problems with high power capabilities, increased insertion loss and costly manufacturing processes. Conventional bond wires can also cause parasitic inductances, antenna effects and signal cross talk.

It is therefore an object of this invention to provide an improved method of securing an electrical sub-circuit assembly to a printed circuit board.

SUMMARY OF INVENTION

The present invention provides a method for coplanar attachment and interconnection of electronic devices and assemblies by forming a cavity or "basin" feature within the main circuit platform. This basin accommodates the shape of the sub-circuit assembly, with the depth of the basin being equal to the thickness of the sub-circuit assembly, with suitable adjustment to accommodate any needed adhesives or solder necessary to fix the sub-circuit assembly to the main circuit platform. The basin can be formed for example by machining a finished laminate, such as by a mechanical milling process or by laminating two or more suitably shaped planar pieces together.

This invention provides a low cost and reliable circuit assembly method by permitting a sub-circuit assembly to be placed directly on a main circuit platform by an automated machine, then physically fastened with proper adhesive or solder paste dispensed by an automated machine and then electrically connected with the aid of an automatic machine.

This invention renders it possible to both physically and electrically attach either an individual component or a more sophisticated sub-circuit assembly to a main circuit platform such that one surface of the sub-circuit assembly is coplanar with the surface of the main circuit platform. Simple planar electrical connection techniques can then be applied between the sub-circuit and main circuit assemblies, thereby eliminating the need for bond wires and improving impedance match and current carrying capabilities and reducing insertion loss between the sub-circuit assembly and the main circuit platform.

This invention also eliminates the need for a package to house the sub-circuit assembly and the wire bonds or bump connectors which are used to connect within a package. The elimination of such a package permits the deposition of biological or other chemical layers without the intrusion of wires or package geometries.

This invention can be used in a wide range of electronic products. Particular utility can be found in the following:

(a) Attachment of sensors: this invention is useful in attaching a sub-circuit die to a platform assembly where the active surface of the die must face upwardly and be exposed. The active surface may include elements such as biological and chemical sensors, MEMS devices and optical devices. These sensors would function in either the vapour or liquid phase. The active surface of the die and the platform assembly, being coplanar, will produce less aerodynamic or fluid-dynamic turbulence or impediments in the vicinity of the active surface when compared with conventional bond wire interconnections.

(b) Radio frequency (RF) products: the coplanar nature of interconnections in accordance with the invention minimizes RF parasitic effects and impedance mismatch, leading to higher operating efficiency and better performance. In a cell phone for example, this means better sensitivity and longer battery life. At a more detailed level, this interconnection technique in accordance with the invention permits direct microstrip launching from the main circuit board platform into a sub-circuit assembly which may house a RF semiconductor device. This invention enables the removal of the high frequency barrier inherent to conventional bond wires at microwave and millimeter-wave applications and the coplanar feature assists in extending the operating frequency range.

This invention may also permit significant cost savings by eliminating expensive coaxial or other interconnection methods between circuit boards. Interconnection is particularly difficult with radio frequency circuitry. Over a broader range of electronic products, this invention provides an alternative to the prevailing motherboard/daughterboard paradigms in which daughterboards (sub-circuit assemblies) are positioned either parallel or perpendicular to motherboards (main circuit assemblies) and interconnected by bulky and expensive connectors or cables.

In radio frequency products, the ability to combine dissimilar platform materials may lead to cost reduction. For example, a sub-circuit assembly comprising a small amount of higher cost low-loss material can be coplanar mounted into a larger cheaper yet higher-loss main circuit platform. The noise figure of a receiver can be enhanced by providing the sub-circuit LNA portion on a small low-loss material such as a ceramic material, while the main circuit can benefit from the low cost and mechanical strength of regular epoxy-fibreglass (FR4) circuit board material.

(c) Miniaturization and low profile design: this invention makes it possible to make "flatter" circuit assemblies. By embedding the sub-circuit assemblies within the main circuit board, parts will not project above the main circuit board, thus resulting in potentially lower overall thickness of an assembly, and the better protection of components.

Typically, packaged sub-circuits which rely on bond wires to complete electrical connections between the components and package are limited to the size of the bond wire and the inductance and resistive impedance characteristics of the bond wire. It is difficult to provide packaged sub-circuits which utilize conductive bump techniques with good inductance and resistance characteristics due to the small cross-sectional area at the point of electrical contact within the bump. The present invention eliminates the costly package and electrical connectivity requirement between the component and package with bonding or conductive bump processes. An improvement in current carrying capabilities, less insertion loss and impedance matching may also be a direct result of the present invention. Instead of having electrical signals flow through very small diameter bond wires or the narrow cross-sectional area of conductive bumps, electrical signals with the present invention can flow through properly dimensioned electrical paths to maintain current carrying, insertion loss and impedance match integrity.

Interconnections which utilize small diameter bond wires typically have a higher inductance and resistance values than for interconnections utilizing solder, conductive adhesive or SMT components. The inductance of a wire can be approximated using equation 1 (from "RF Circuits Design", C. Bowick, Howard W. Sams Company, ISBN: 0-672-21868-2).

$$Lwire = 0.002(l)\left(2.3\text{Log}\left(\frac{4(l)}{D} - 0.75\right)\right) \quad (1)$$

For a wire of 0.001 inches in diameter (D) and 1 mm in length (l) a value of 1.01 nH is derived from equation (1). This value compares favourably with 3D bond wire electrical modeling data published by the Electrical Packaging Group of Amkor Technology. A value of 0.606 nH is derived from Amkor's 3D modeling approximation found in equation (2).

$$L11=1.0703(l)-0.4641 \quad (2)$$

The approximate inductance of a 0402 defined SMT resistance component of zero ohms using equation (1) is 0.150 nH and is derived by replacing the width of the 0402 SMT with the diameter D of equation (1). This is a lower value than for a single bond wire of the same length. However, several bond wires in parallel would reduce the bond wire inductance to a lower value than that of the SMT component's inductance but with much more additional complexity in the wire bonding process.

The comparison of the resistance values of the bond wires versus the SMT 0402 component is slightly more complicated as a phenomena called the skin effect occurs. As the frequency of the signal passing through a conductive block is increased, the current tends to flow near the surface of the block and not through its centre. Equation (3) describes how the depth of this current carrying layer is calculated.

$$\delta = \sqrt{\frac{2}{\omega\mu\sigma}} \quad (3)$$

Where, $\omega$ is the frequency component, $\mu$ is the permeability of the current carrying block and $\sigma$ is the conductivity of the current carrying block. Typically, it can be assumed that the current flows in several layers each $\delta$ thick for a total of n$\delta$ thickness where n is the number of layers.

The calculation of the resistance for a wire of 0.001 inches in diameter (D) and 1 mm in length (l) is illustrated in equation (4), where area is the cross-sectional area of the bond wire where the current flows. This value is then calculated as 0.129Ω.

$$R = \frac{l}{\sigma(Area)} \quad (4)$$

This value again compares favourably with 3D bond wire electrical modeling data published by the Electrical Packaging Group of Amkor Technology. A value of 0.127Ω is derived from Amkor's 3D modeling approximation found in equation (5).

$$R11=128.7(l)-2.0149 \quad (5)$$

The approximate resistance of a 0402 defined SMT resistance component of zero ohms using equation (4) and accounting for skin depth $\delta$ is 0.000925Ω and is again derived by replacing the width of the 0402 SMT with the diameter D for the calculation of the area of equation (4).

This large difference of resistance values between bond wires and the SMT 0402 component would impact the current carrying capabilities of the bond wire along with an increase in losses when compared with the conductive adhesive and SMT 0402 component. Similar results would also apply to the narrow cross-sectional area associated with a conductive bump.

The present invention is specially useful with respect to sensor devices utilizing surface acoustic wave (SAW) or other acoustic wave (AW) devices.

Example of use of acoustic wave devices in conjunction with RF components are well described in:

U.S. Pat. No. 5,488,866, TIME-INTERLEAVED METHOD FOR EFFICIENT OPERATION OF AN ACOUSTIC WAVE SENSOR ARRAY, and in Hunt's publication, W. D. Hunt, D. D. Stubbs and S. H. Lee, "Time-dependent Signatures of Acoustic Wave Biosensors," *IEEE Proceedings*, Vol. 91, no. 6, pp. 890-901, June 2003.

The present invention is an improvement over Yatsuda's method which incorporates conductive bumps but still requires a separate package, described in:

U.S. Pat. No. 5,252,882, SURFACE ACOUSTIC WAVE DEVICE AND ITS MANUFACTURING METHOD", and his publications;

H. Yatsuda, H. Iijima, K. Yabe and O. Iijima "FLIP-CHIP STW FILTERS IN THE RANGE OF 0.4 TO 5 GHZ," IEEE UFFC Symposium, October, 2002. Japan Radio Co., Ltd., Kamifukuoka-shi, Saitama. 356-0011 Japan Hiromi Yatsuda, Taira Horishima, Takeshi Eimura, and Takao Ooiwa Miniaturized "SAW Filters Using a Flip-Chip Technique," IEEE TRANSACTIONS ON ULTRASONICS, FERROELECTRICS, AND FREQUENCY CONTROL, VOL. 43, NO. 1, pp. 125-130, January 1996.

Another area in which this invention provides improvement is the simpler refinement of the full-wave analysis using a finite-element simulation between the package and bond wires. An example of this modeling is shown in:

C. Finch, Xiaomin Yang, T. X. Wu and B. Abbott, "RF Saw Filter Package Design For Wireless Communications," Microwave And Optical Technology Letters, Vol. 39, No. 5, Dec. 5, 2003.

The elimination of the bond wires will greatly reduce the complexity of the connectivity model.

Other attempts to eliminate the wire bonds require soldering techniques to complete the connectivity between the component die and the electrical substrate as shown in:

U.S. Pat. No. 6,731,000 B1, Haque, FOLDED-FLEX BONDWIRE-LESS MULTICHIP POWER PACKAGE.

Haque et al requires as described in this patent the placement of connectivity studbumps on the die. These three dimensional studbumps allow for sufficient contact within a soldering process and may not function with a flat contact as described within this Patent. Coplanar design techniques would still be difficult with Haque's method.

The present invention is also well suited for sensor applications in which a biologically coated acoustic wave device is submerged in water for the detection of target molecules. The coplanar feature of die attachment provides a simpler method of placing a potting medium to cover the electrical portion of the die and not cover the biological area within the die. The submerged device would only allow an interface between the exposed biological layer and the water. Since there are no bonding wires protruding from the die which may be harmed during the potting process, the coplanar method and structure of the present invention is a significant improvement over the prior art.

A coplanar bridge connection in accordance with the invention may connect a transmission line microstrip structure on the motherboard to a corresponding structure on the sub-circuit assembly (daughterboard). The bottom of the basin can be a groundplane which is contiguous between the sub-circuit assembly and the motherboard. The benefit of such an interconnection is that it is receptive to RF signals, which is particularly important with ever-increasing computer central processor operating frequencies and with the increasing miniaturization and increasing operating frequencies of wireless devices.

Thus, this invention improves the method and structure of the sub-circuit attachment process onto a main circuit electrical platform. The sub-circuit assembly being attached may be a discrete packaged or unpackaged die, semiconductor device (transistor, diode, etc.), an integrated circuit in die (or bumped die) form, quartz devices such as crystals, filters, resonators, surface acoustic wave (SAW), surface transverse wave (STW), bulk acoustic wave (BAW), piezoelectric transducers, micro mechanical systems (MEMS) devices, chemical sensors, biological sensors, light emitters and light sensors. A sub-circuit assembly is generally attached to an electrical platform which is a specially prepared printed circuit board which could be made from any common laminate material, including epoxy fibreglass, phenolic, PTFE, alumina, etc. This invention is particularly effective for attaching sub-circuit assemblies which are incompatible with conventional soldering techniques used to attach components to circuit boards. Such incompatibility may be due to temperature sensitivity, or sensitivity to chemicals such as fluxes used in the soldering procedure within the electronics manufacturing process. This invention is also particularly useful for attaching sub-circuit assemblies to main circuit electrical platforms in cases where the surface of the component used for electrical connections must be facing upwards and/or exposed to ambient environment.

DESCRIPTION OF THE DRAWINGS

Embodiments of the invention will now be described, by way of example, with reference to the accompanying drawings, of which.

DESCRIPTION OF PREFERRED EMBODIMENTS

Figure 1:
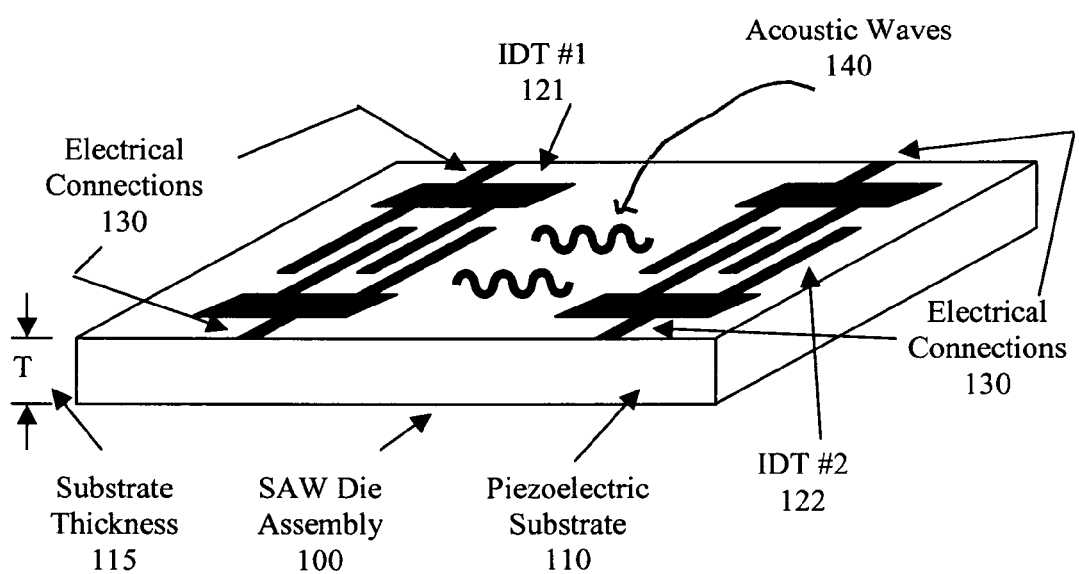
FIG. 1 is a diagrammatic perspective view of an acoustic wave device of a bare die.

Referring to the drawings a surface acoustic wave (SAW) die assembly 100 is shown in FIG. 1. A first interdigital transducer (IDT) 121 is suitably located on a piezoelectric substrate 110 of thickness T 115. The IDT 121 transforms an electrical signal into an acoustic wave and, being a reciprocal mechanism, also transforms an acoustic wave into an electrical signal. A second IDT 122 is suitably located along the propagation path of the acoustic waves 140. An IDT has inherent impedance which is a function of the physical geometry of the IDT. The IDT electrical connections 130 can thus be designed to match the impedance value of the adjacent IDTs 121, 122. The electrical connections 130 are similar to microstrip geometries and are suitably scaled in dimensions to also achieve an impedance equal to the inherent impedance of the IDTs 120, 122. The electrical connections 130 are located to bring the electrical interconnections of the circuit on the die substrate 110 to the periphery thereof.

Other sub-circuit die assemblies with similar physical geometries are also within the scope of this invention. The main criteria is that the electrical connections 130 bring to the physical periphery of the sub-circuit assembly and the die substrate 110 an electrical connection which matches the impedance of the equivalent internal circuitry 121, 122. Sub-circuit die assemblies may also have electrical connections 130 positioned on either the top or bottom or both layers of the assembly.

Although the best benefit can be achieved if bare die sub-circuit assemblies are attached to a main circuit electrical platform, it is also within the scope of the invention to attach packaged semiconductor devices to electrical platforms, such as circuit board assemblies with the actual packaged semiconductor devices being placed upside down. Packaged radio-frequency sub-circuits can be attached to a main circuit in this way with minimal impedance mismatch. The connectors of the packaged sub-circuit are equivalent to the electrical connections 130 shown in FIG. 1.

Figure 2:
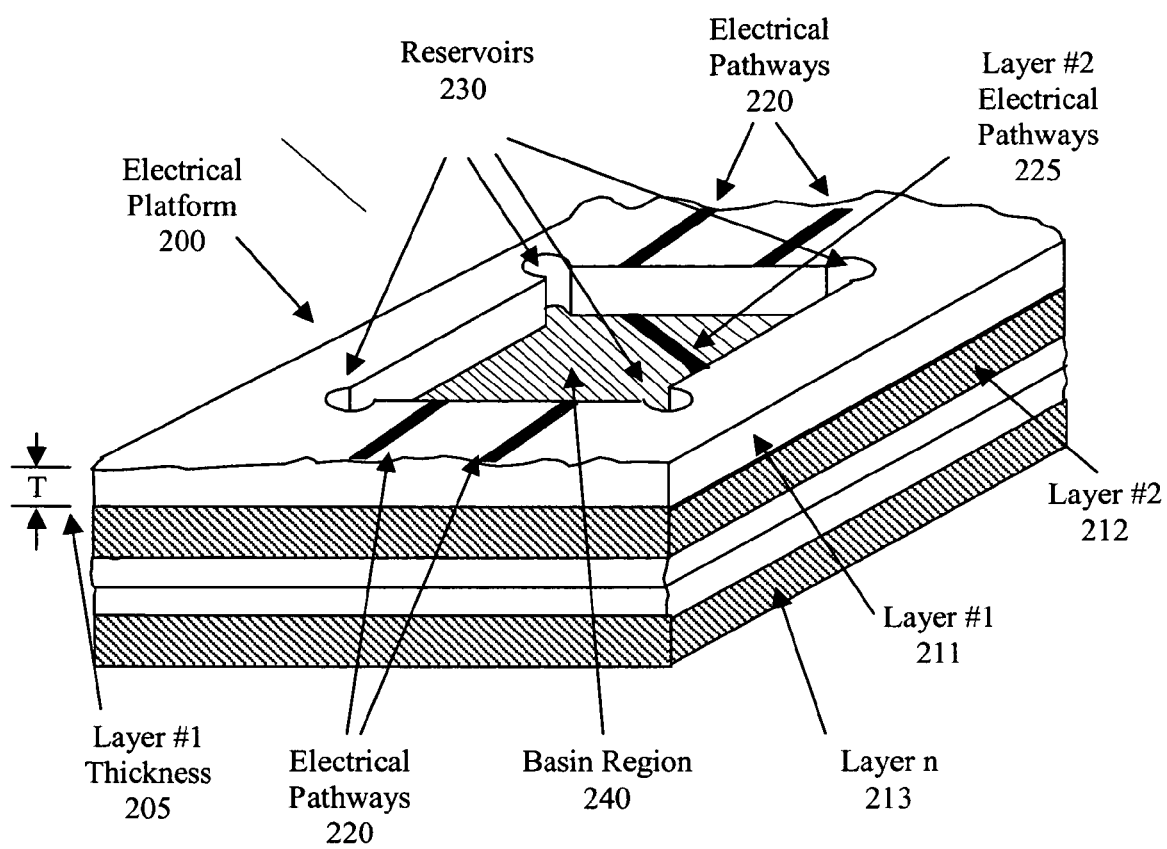
FIG. 2 is a similar view of a main circuit platform comprising a multi-layer printed circuit board in accordance with one embodiment of the invention, showing basin details and electrical pathways.

The SAW die component shown in FIG. 1 is placed within an electrical platform 200 of the main circuit assembly shown in FIG. 2. A multi-layer printed circuit board (PCB) is used as an example to explain the method and structure of coplanar die attachment. The first layer 211 with physical thickness T 205 has electrical pathways 220 which provide electrical interconnections between components of other electrical connections. Within the first layer 211, a basin region 240 is located at the physical position where the sub-circuit assembly such as the piezoelectric die substrate 110 is to be located. The reservoirs 230 which will receive excess adhesive material are a result of cutting reliefs during the milling process and are suitably placed so as not to interfere with the electrical pathways 220. In this embodiment, the reservoirs 230 are placed at the four corners of the basin region 240. The basin region 240 exposes a second layer 212 of the electrical platform structure 200 along with the electrical pathways 225 of the layer 212. The electrical pathways 225 of layer 212 are physically expanded to allow the formation of a metal ground plane suitable for microstrip geometries. Other layers, up to layer n 213 complete the structure of the electrical platform 200.

The basin region 240 can be formed either by machining a finished laminate, by mechanical milling or other means of material removal, or by laminating two or more planar pieces together. For milling, the basin region 240 is milled within the first layer 211 to a depth equal to the thickness of a sub-circuit assembly to be attached with an adjustment to accommodate any needed adhesives and adjusted in thickness geometries to accommodate any needed adhesives or solder used to affix the sub-circuit assembly within the basin region 240. For lamination, two or more layers of laminate are joined together. The first layer 211 is the same thickness as the sub-circuit assembly with an adjustment to accommodate any needed adhesives or solder used to affix the sub-circuit assembly. The first layer 211 has a portion of its material removed before the lamination process to produce an opening which is the same shape as the perimeter of the sub-circuit assembly. For a simple embodiment, the second layer 212 would be the bottom piece and be void of any basins, and the first layer 211 and the second layer 212 would be laminated together, forming the basin 240.

Figure 3:
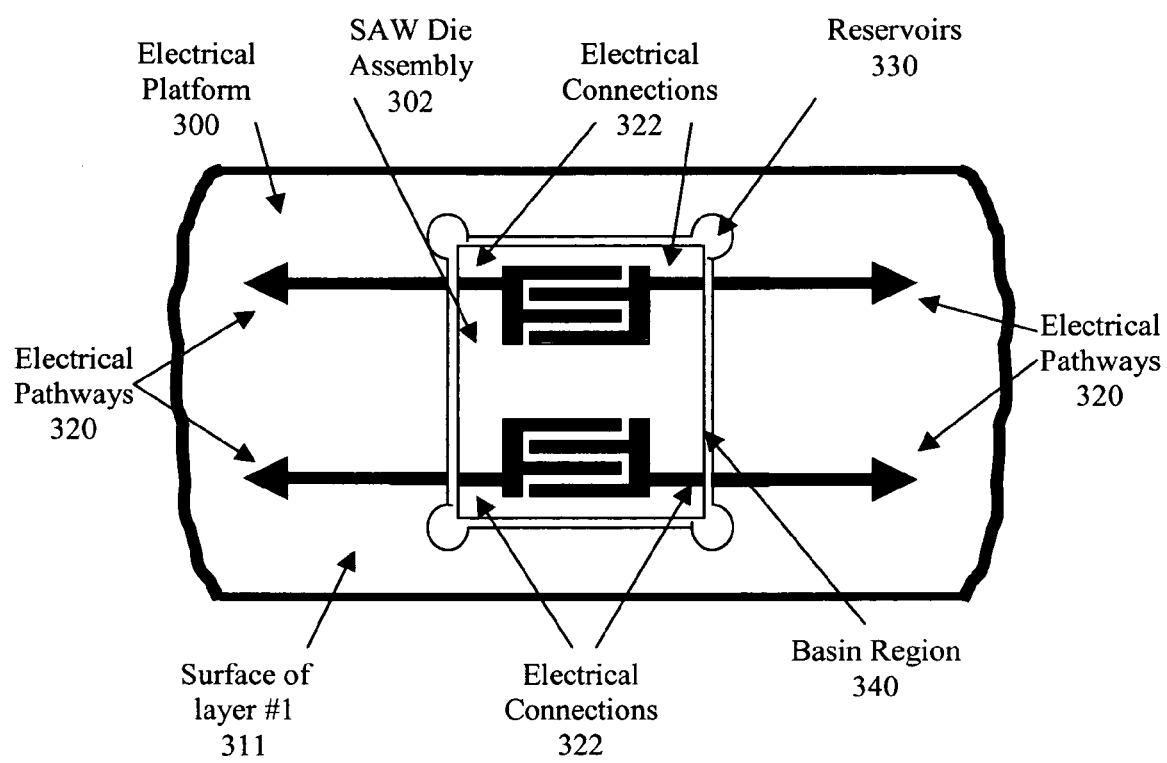
FIG. 3 is a diagrammatic plan view showing a SAW die placed in the basin in the multi-layer printed circuit board.

The physical placement of a sub-circuit assembly such as a SAW die assembly 302 within a basin region 340 located within an electrical platform 300 is shown in FIG. 3. The perimeter dimensions of the basin region 340 are such that the SAW die assembly 302 can be placed within the basin region 340 to minimize the gap between the SAW die assembly 302 and the top surface of the first layer 311. The dimensions of the basin region 340 are also such that electrical pathways 320 situated on the surface of the first layer 311 align themselves with electrical connections 322 of the SAW die assembly 302. The first surface layer 311 is coplanar with the surface of the SAW die assembly 302 such that both have a minimum difference in height and gap between them. For other assembly components, the dimensions and coplanar positioning of a sub-circuit assembly would also be such that the electrical pathways 320 and the second layer 212 shown in FIG. 2 would align themselves with the die assembly electrical connections 322 located on either or both sides of the SAW die assembly 302. The reservoirs 330 are positioned so as not to interfere with any electrical pathways 320 or electrical connections 322. The reservoirs 330 are constructed such that a part of the geometry of the die 302 either extends into each reservoir 330 or lies directly adjacent to it.

Figure 4:
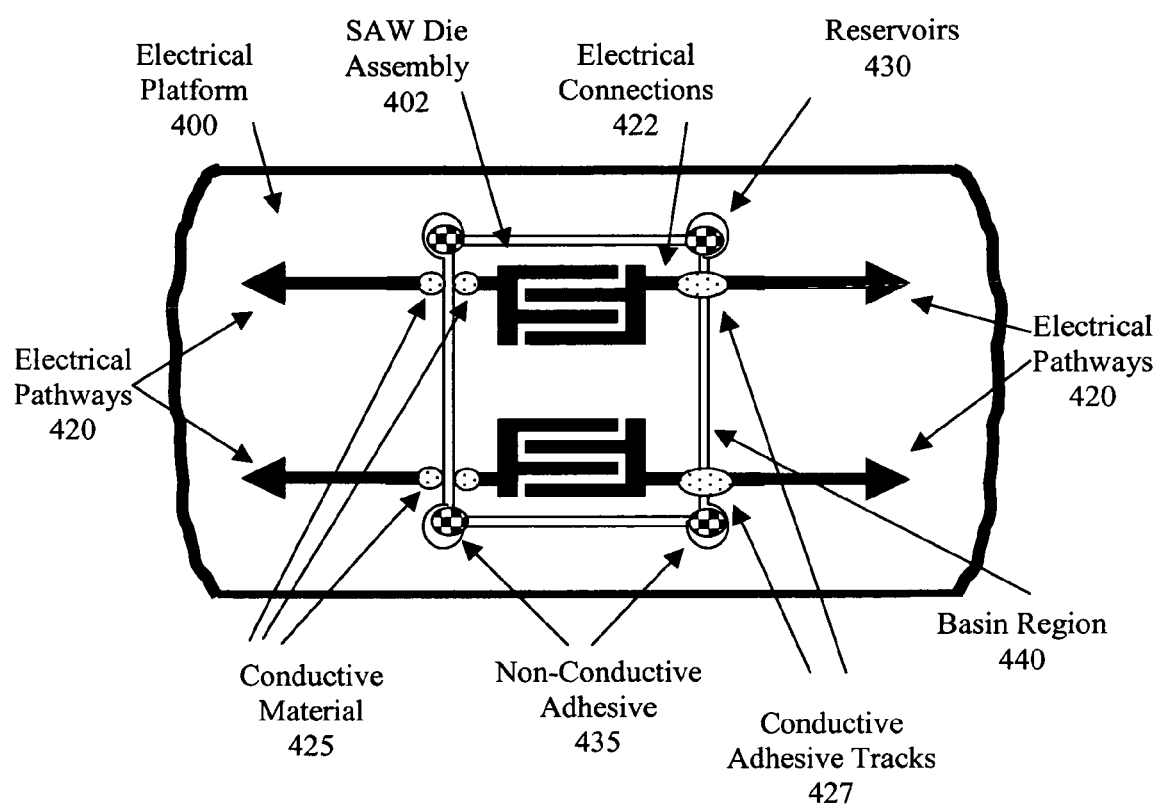
FIG. 4 is a similar view showing conductive adhesive dots placed on both the die and electrical traces of the printed circuit board and a non-conductive adhesive to secure the die.

The physical attachment of a sub-circuit SAW die assembly 402 to a main circuit electrical platform 400 is shown in FIG. 4. Physical attachment of the SAW die assembly 402 to the main circuit electrical platform 400 is required to eliminate any possible lateral movement of the SAW die assembly 402 during the electrical connection processing or post manufacturing of the main circuit electrical platform 400. The SAW die assembly 402 or other equivalent sub-circuit assembly is retrieved from a tray or reel and placed by a surface mount technology (SMT) machine into a basin region 440. A non-conductive adhesive 435 is then properly dispensed either manually or with an automated process utilizing an SMT machine, stenciling, pin transfer or syringe-dispensing into the reservoirs 430. The viscosity of the non-conductive adhesive 435 is chosen so that it makes contact with the SAW die assembly 402, the geometric surfaces of the basin region 440 and the top surface of the second layer 212. For some non-conductive adhesive products, a temperature curing process would then improve the rigidity of the non-conductive adhesive 435 to prevent further movement of the SAW die 402. Curing the non-conductive adhesive can be achieved for example with ultraviolet light, moderate temperature baking, normal solvent evaporation or chemical reaction.

The electrical attachment of the SAW die assembly 402 to the main circuit electrical platform 400 can be accomplished by several methods. A first method involves continuous conductive adhesive tracks 427 which are dispensed either manually, or preferably with a placement/dispensing machine, beginning on the electrical pathways 420 of the electrical platform 400 and continuing with a continuous conductive track onto the closely adjacent electrical connections 422. The continuous nature of the conductive adhesive track 427 completes the electrical connection between the electrical pathways 420 and the adjacent electrical connections 422.

A second method involves the placement of dots 425 of conductive material on certain areas of the electrical pathways 420 and electrical connections 422, the conductive material being in the form of conductive adhesive or solder paste. The conductive material can be dispensed either manually of with an automated process utilizing a placement/dispensing machine, stenciling, pin transfer or syringe dispensing methods onto the electrical pathways 420 located on the electrical platform 400 and separately onto the closely adjacent electrical connection 422 of the SAW die assembly 402. The resultant conductive dots 425 are positioned adjacent each other at the end extremities of the electrical pathways 420 and electrical connections 422.

Figure 5:
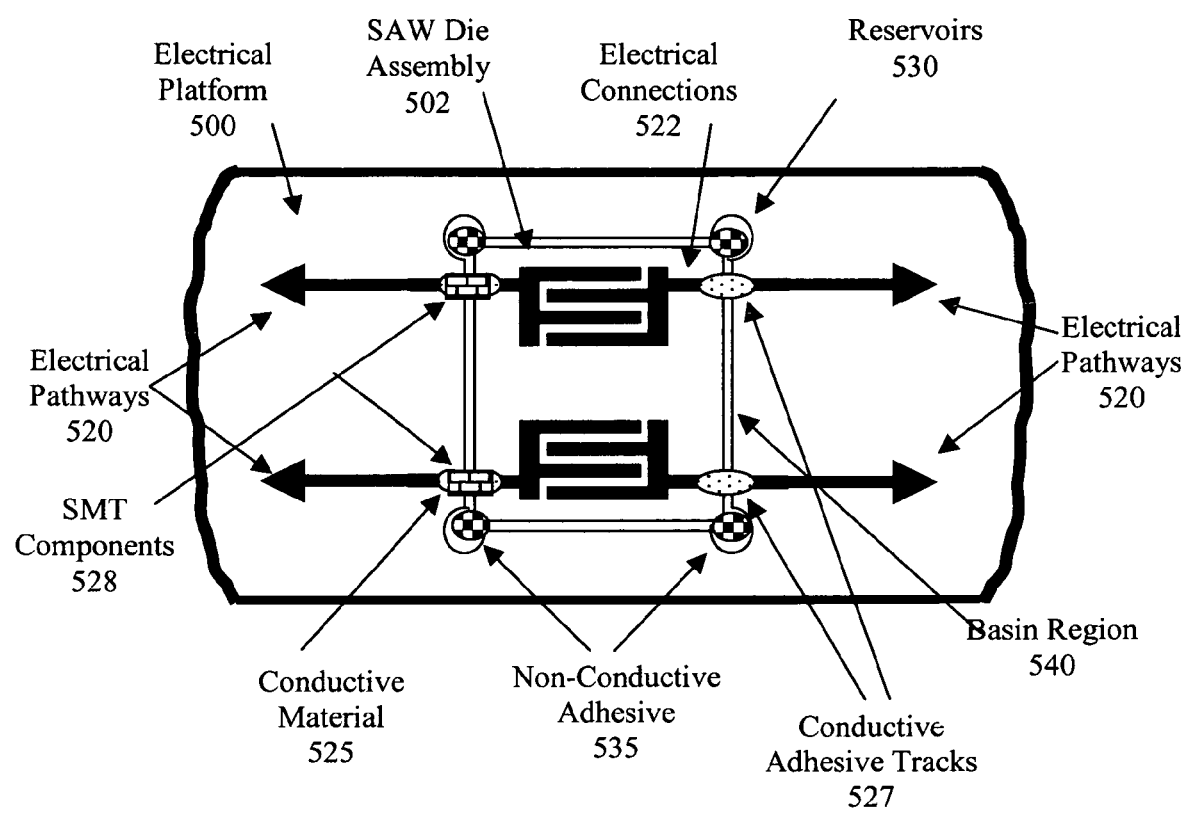
FIG. 5 is a similar view showing zero Ohm SMT resistors located on the conductive dots placed on both the dies and electrical traces of the printed circuit board.

This method is further illustrated in FIG. 5. The completion of the electrical circuits between the SAW die assembly 502 and other circuitry located on the electrical platform 500 and connected by electrical pathways 520 is accomplished by either a standard SMT zero ohm resistor or other value SMT component 528, or piece of conductive material, dispensed either manually or with an automated process onto the conductive dots 525. For example, both interconnection and AC coupling can be achieved simultaneously by using a chip capacitor SMT component 528. Also, active devices such as SMT packaged transistors or integrated circuits including ball grid arrays (BGAS) or flip-chips can be used instead of the SMT component 528. For some conductive material products, a temperature curing process can improve both the physical structure and the conductivity between the conductivity adhesive material 525 and the SMT component 528. Curing can be achieved with ultraviolet light, moderate temperature baking, normal solvent evaporation or chemical reaction. In the case of more robust devices which are temperature tolerant, the dots 525 of solder paste conductive material can be processed by any common soldering method, including convection reflow, vapour phase reflow, hot-plate conduction, hand-soldering, wave-soldering and laser or xenon beam selective soldering. For other sub-circuit assemblies with similar physical geometries and with electrical connections such as a ground plane on the bottom face of a die, an initial step must be performed before the die is placed within the basin. Referring to FIG. 2, a conductive material is suitably dispensed either manually or with an automated process onto the electrical pathways 225 of the second layer 212 before the die is place within the basin.

Figure 6:
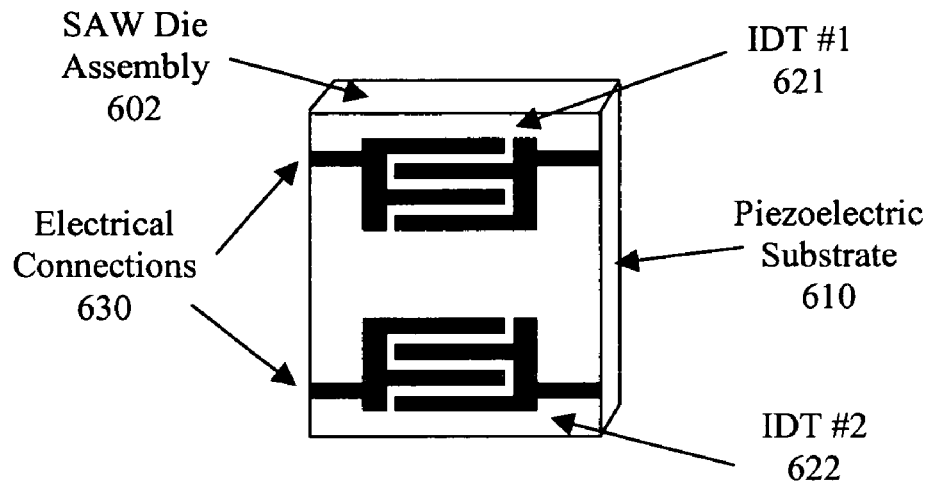
FIG. 6a is a diagrammatic perspective view of an acoustic wave device on a bare die.
FIG. 6b is a similar view showing a suitable coating for handling by an SMT machine, and a window in the coating for exposing sensitive material.
Figure 6:
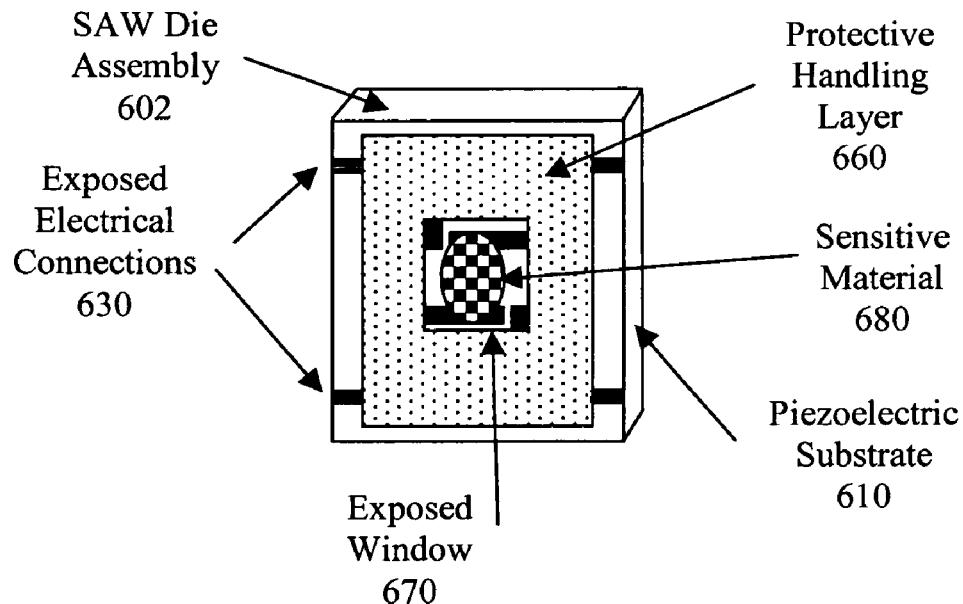

An important issue which arises during placement of the sub-circuit assembly on the main circuit electrical platform is the potential damage to the exposed circuitry on the surface of the sub-circuit assembly during automated placement. By way of example, FIG. 6a shows a SAW die assembly 602 fashioned onto a piezoelectric substrate 610. Interdigital transducers such as first and second IDTs 621, 622 and electrical connections 630 are typically fabricated using thin film techniques. The thin film could be damaged as a vacuum chuck or other handling apparatus of an SMT machine imposes pressure on the die assembly 602. One way of protecting the die assembly 602 is to selectively coat part of the surface of the die assembly with a protective handling layer 660 as shown in FIG. 6b. The protective handling layer 660 should be applied as early as possible in the manufacturing process of the die and, if possible, before the die assembly is separated from its original wafer or equivalent form. The protective handling layer 660 can be arranged to provide correct exposure of the electrical connections 630 and thereby enable proper placement of the conductive adhesive 525, conductive adhesive tracks 527 and the standard SMT components 528 shown in FIG. 5.

Such processing may also involve the provision of a window 670 in the protective handling layer 660. The window 670 permits the post processing of a suitable sensitive material 680, such as a biological, polymer or other interface material, to be applied to enhance the SAW die assembly 602 in its role as a sensor. The sensitive material 680 is attached to the exposed surface of the die 602 and operates to transform measurable constituent vapour or liquids which can be detected by the circuit parameters of the sub-circuit assembly. The window 670 exposes the part of the die assembly circuitry, for example the first and second IDTs 621, 622 shown in FIG. 6a and which produce the required sub-circuit assembly parameter change.

Figure 7:
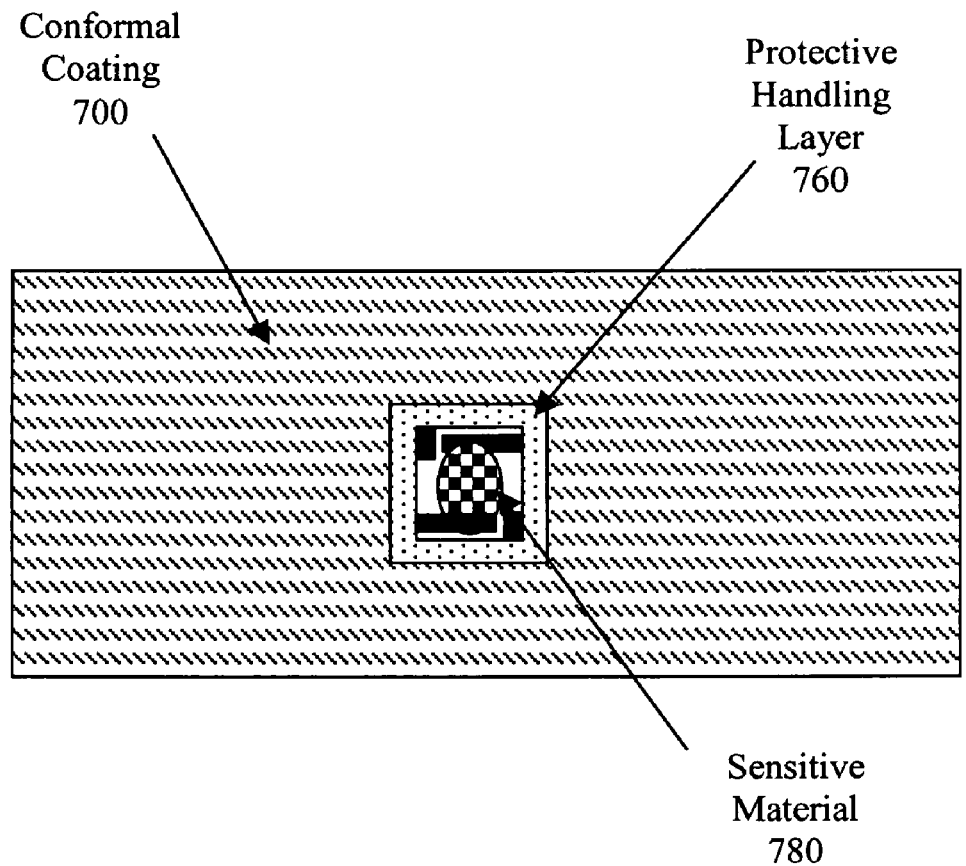
FIG. 7 is a plan view of the product shown in FIG. 6b with a conformal coating layer over the main circuit platform for protection against vapours and liquids.

Another important issue which then arises is the potential damage to the circuitry and PCB when certain vapours or liquids come into contact with areas surrounding the window 670. FIG. 7 illustrates how a conformal coating 700 can cover the electrical platform 500, die assembly 502, electrical pathways 520, electrical connections 522, conductive adhesive dots 525, conductive adhesive tracks 527 and the SMT components 528, as shown in FIG. 5. This permits the sensitive material 780 and a partial protective handling layer area 760 to be exposed to a vapour or liquid, with the remainder of the circuit and components shown in FIG. 5 being isolated therefrom.

The advantages of the invention will now be readily apparent to a person skilled in the art from the foregoing description of preferred embodiments. Other embodiments will also now be readily apparent, the scope of the invention being defined in the appended claims.

The invention claimed is:

1. An electrical circuit assembly comprising a printed circuit board and an electrical sub-circuit assembly secured thereto, wherein:
   the printed circuit board has an upper surface and a basin defined therein, and electrical pathways extend along the upper surface of the printed circuit board and terminate adjacent the basin;
   the sub-circuit assembly has dimensions corresponding to the size of the basin, the sub-circuit assembly is secured in the basin and is a close fit therein, the sub-circuit assembly has an upper surface having electrical connections thereon adjacent the periphery of the upper surface of the sub-circuit assembly;
   the electrical connections on the upper surface of the sub-circuit assembly are each electrically connected to a respective electrical pathway on the upper surface of the printed circuit board across a respective gap between the upper surface of the sub-circuit assembly and the upper surface of the printed circuit board;
   the upper surface of the printed circuit board adjacent the basin and the upper surface of the sub-circuit assembly are substantially coplanar with one another; and
   the sub-circuit assembly is secured in the basin by adhesive and the printed circuit board has reservoirs adjacent the basin receiving excess adhesive from the securing operation.

2. The electrical circuit assembly according to claim 1 wherein the sub-circuit assembly comprises an acoustic wave (AW) device having interdigital transducers (IDTs) carried by and spaced apart along an upper surface of a piezoelectric substrate, the upper surface of the AW device being substantially coplanar with an adjacent surface of the printed circuit board.

3. The electrical circuit assembly according to claim 1 wherein the printed circuit board comprises a laminate and the basin is formed by an aperture in an upper layer thereof, with an adjacent layer providing the basin with a bottom.

4. The electrical circuit assembly according to claim 1 wherein the sub-circuit assembly comprises an acoustic wave (AW) device.

5. The electrical circuit assembly according to claim 2 wherein a layer of protective material is secured over the upper surface of the AW device to protect the IDTs, said protective layer having an aperture exposing an area of the upper surface of the AW device between the IDTs.

6. The electrical circuit assembly according to claim 5 wherein sensitive material is secured to the upper surface of the AW device such that the sensitive material appears in said window, said sensitive material being sensitive to the presence of a predetermined substance in the ambient atmosphere to modify the operation of the AW device.

* * * * *